(12) United States Patent
Chien et al.

(10) Patent No.: US 9,711,367 B1
(45) Date of Patent: Jul. 18, 2017

(54) SEMICONDUCTOR METHOD WITH WAFER EDGE MODIFICATION

(71) Applicant: Taiwan Semiconductor Manufacturing Co., Ltd., Hsin-Chu (TW)

(72) Inventors: Hung-Chung Chien, Hsin-Chu (TW); Hung-Chang Hsieh, Hsin-Chu (TW); Jhun Hua Chen, Changhua County (TW); Shu-Fang Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/169,922

(22) Filed: Jun. 1, 2016

(51) Int. Cl.
*H01L 21/266* (2006.01)
*H01L 21/308* (2006.01)
*H01L 21/3065* (2006.01)

(52) U.S. Cl.
CPC .......... *H01L 21/308* (2013.01); *H01L 21/266* (2013.01); *H01L 21/3065* (2013.01)

(58) Field of Classification Search
CPC .. H01L 21/308; H01L 21/266; H01L 21/3065
See application file for complete search history.

(56) References Cited

U.S. PATENT DOCUMENTS

| 6,506,688 | B2 | 1/2003 | Wu |
| 7,767,720 | B2 | 8/2010 | Jiang |
| 7,811,857 | B2 | 10/2010 | Yamano et al. |
| 8,008,629 | B2 | 8/2011 | Adamec et al. |
| 8,069,816 | B2 | 12/2011 | Yamamoto et al. |
| 8,133,923 | B2 | 3/2012 | Jiang |
| 8,216,767 | B2 | 7/2012 | Wang et al. |
| 8,323,870 | B2 | 12/2012 | Lee et al. |
| 8,580,117 | B2 | 11/2013 | Kao et al. |
| 8,658,344 | B2 | 2/2014 | Wang et al. |
| 8,715,919 | B2 | 5/2014 | Chang et al. |
| 8,741,551 | B2 | 6/2014 | Wu et al. |
| 2002/0197749 | A1* | 12/2002 | Knight .................... H01L 22/34 438/14 |
| 2006/0014320 | A1* | 1/2006 | Yamano .............. H01L 23/3114 438/113 |
| 2013/0323641 | A1 | 12/2013 | Chang |
| 2014/0011133 | A1 | 1/2014 | Liu et al. |
| 2014/0017615 | A1 | 1/2014 | Chang |
| 2014/0017616 | A1 | 1/2014 | Chang |
| 2014/0065843 | A1 | 3/2014 | Chang et al. |
| 2014/0117563 | A1 | 5/2014 | Yu et al. |
| 2014/0120459 | A1 | 5/2014 | Liu et al. |
| 2014/0186773 | A1 | 7/2014 | Chang |
| 2014/0255850 | A1 | 9/2014 | Chang et al. |
| 2014/0272709 | A1 | 9/2014 | Liu et al. |
| 2014/0272726 | A1 | 9/2014 | Chang |
| 2014/0273521 | A1 | 9/2014 | Wu et al. |

* cited by examiner

*Primary Examiner* — Kyoung Lee
(74) *Attorney, Agent, or Firm* — Haynes and Boone, LLP

(57) ABSTRACT

The present disclosure provides a semiconductor fabrication method. The method includes modifying an edge portion of a wafer such that the edge portion are prevented from resist coating; coating a resist layer on the front surface of the wafer, wherein the resist layer is free from the edge portion of the wafer; and performing an exposing process to the resist layer.

20 Claims, 14 Drawing Sheets

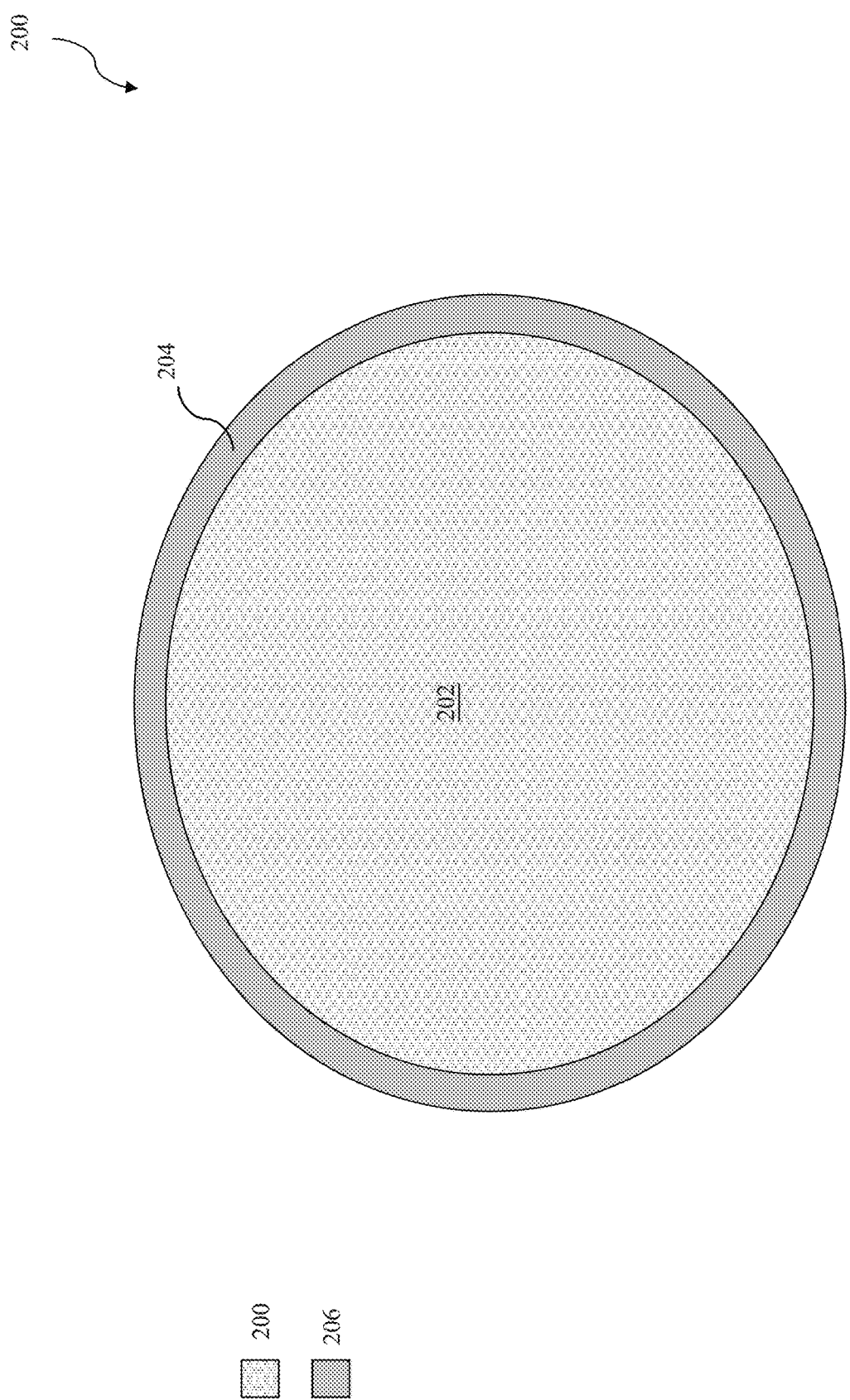

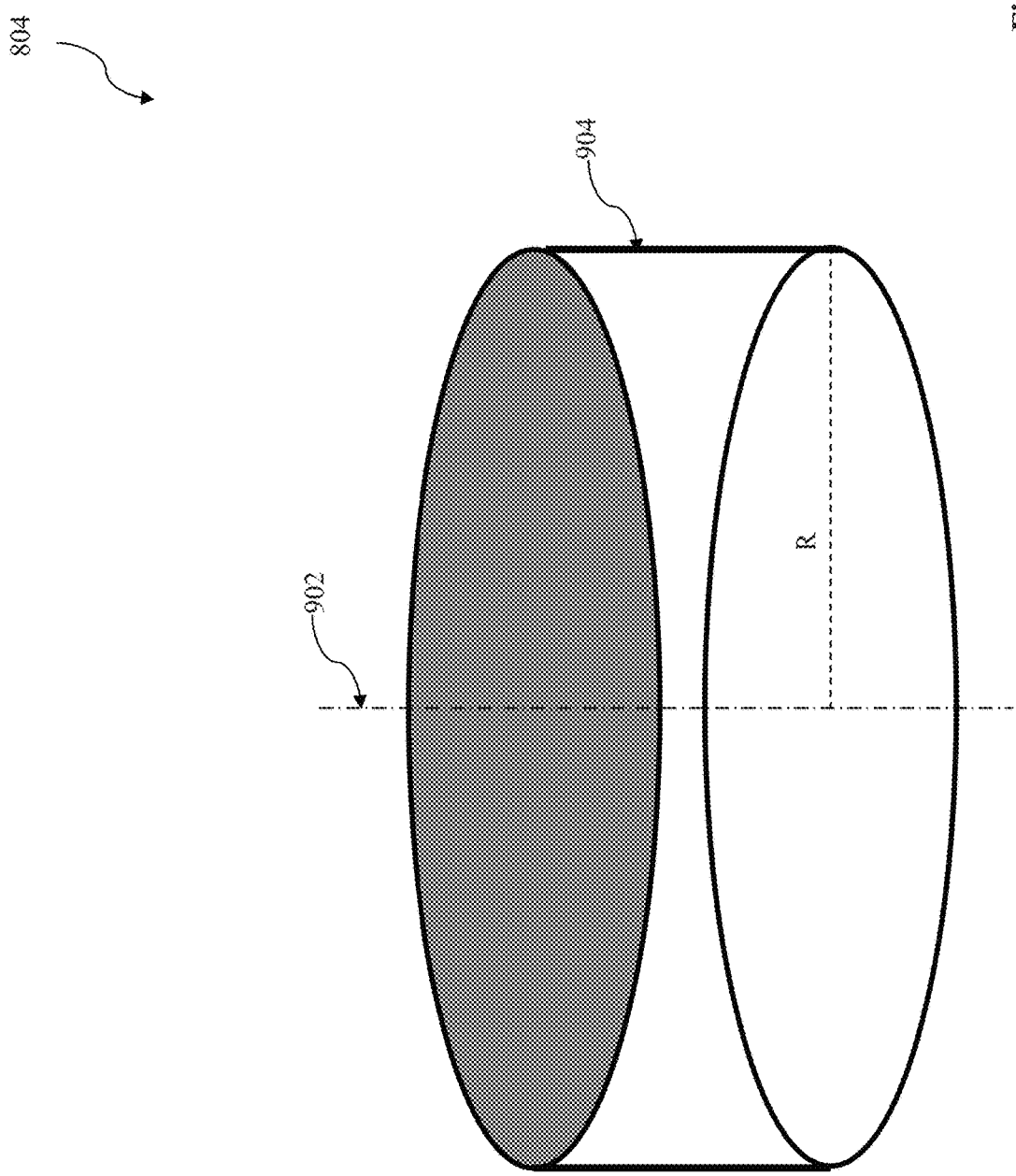

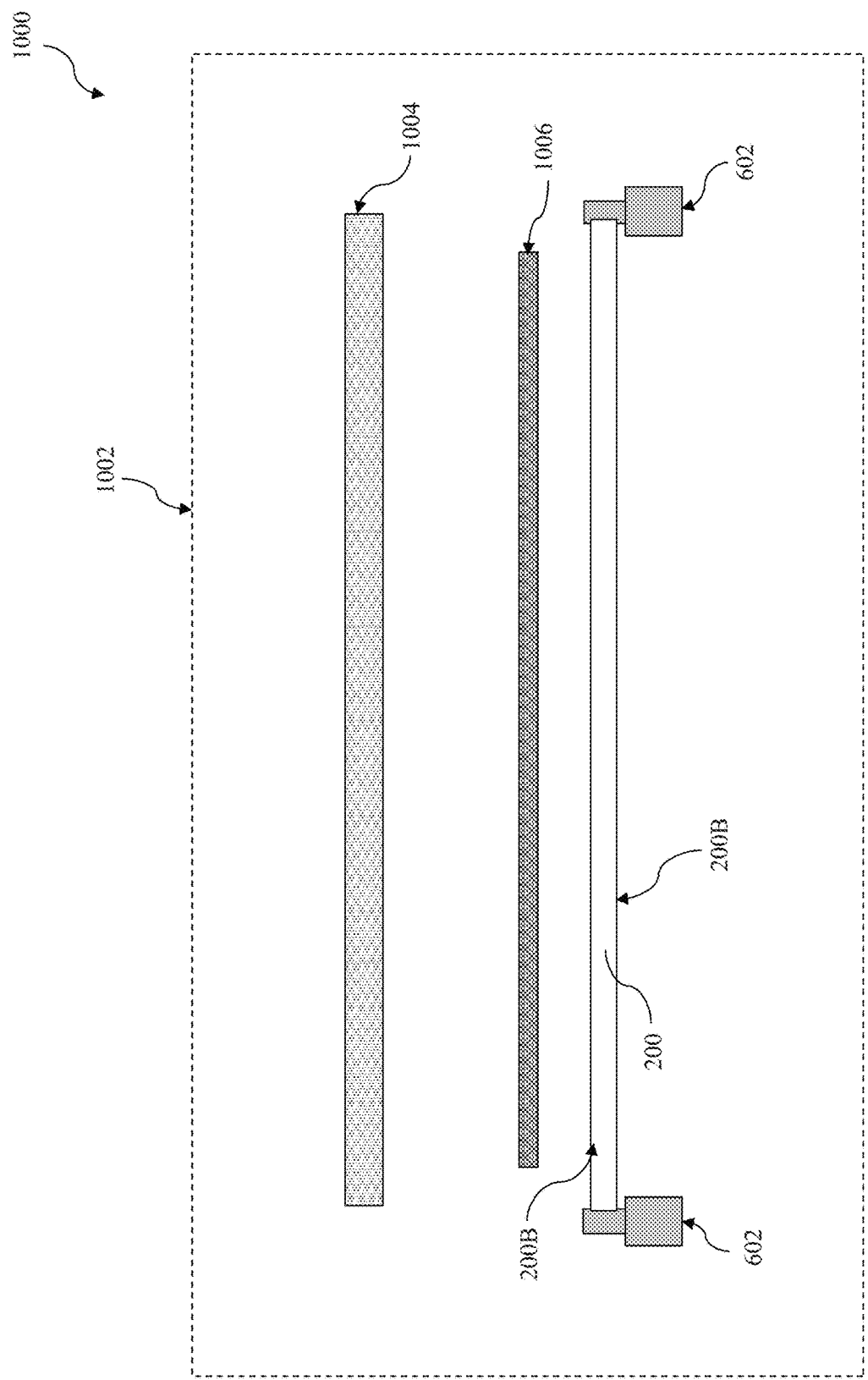

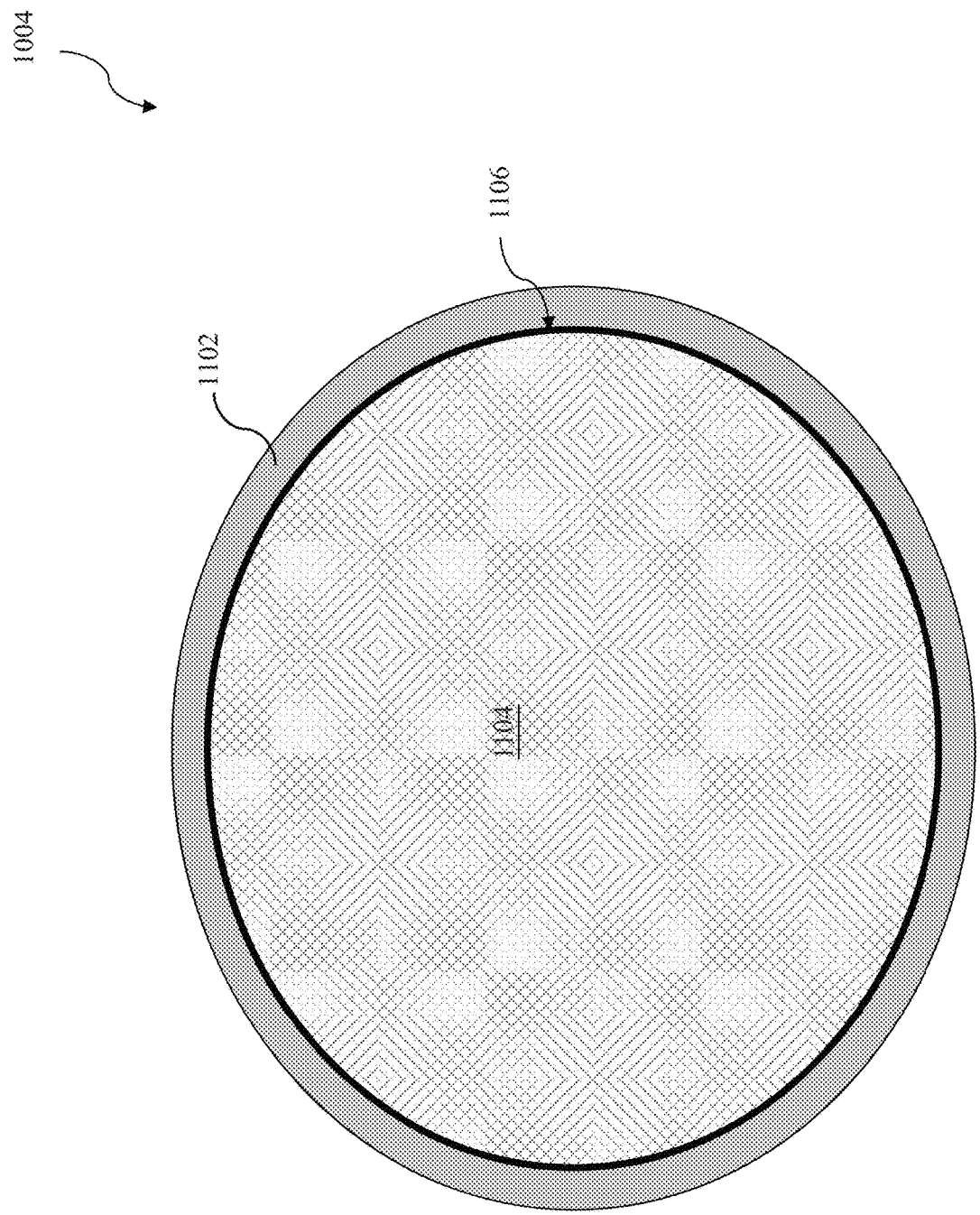

SEMICONDUCTOR METHOD WITH WAFER EDGE MODIFICATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example, advanced lithography patterning technologies are implemented to form various patterns, such as gate electrodes and metal lines, on semiconductor wafers. A lithography patterning technologies include coating a resist material on the surface of a semiconductor wafer.

The existing resist coating method, such as spin coating, forms the resist material on all regions of a wafer including edges of the wafer, even to the backside surface of the wafer. The resist material on the edges and the backside surface of the wafer during the coating process and subsequent processes (such as developing) leads to various contamination-related problems and concerns, such as contaminating the coater chuck or the track. Accumulation of the resist material on the edges of the wafer will disturb patterning stability on the wafer edge and causes erroneous leveling readings during the lithography process. For examples, the presence of the resist material on the bevel and backside not only increases the probability of high hotspot but also has the potential to contaminate subsequent processing tools. In other examples, existing coating process has high resist residual at wafer edges and bevel, which may induce resist peeling and result in poor yield. Various methods are used or proposed to address the issues, such as edge bead rinse and backside rinse. However, the undesired hump was created by edge bead rinse and backside rinse, which is potential defect source in the following processes. Accordingly, it would be desirable to provide a system and a method of utilizing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussions.

FIG. 2B is a top view of the wafer in FIG. 1, constructed in accordance with some embodiments.

FIG. 10 is a top view schematic view of a blocker used in the deposition apparatus in FIG. 9, constructed in accordance with some embodiments.

FIG. 11 is a schematic and sectional view of a deposition apparatus used by the method in FIG. 1, constructed in accordance with some embodiments.

FIG. 12 is a top view of a target used in the deposition apparatus in FIG. 11, constructed in accordance with some embodiments.

DETAILED DESCRIPTION

Figure 1:
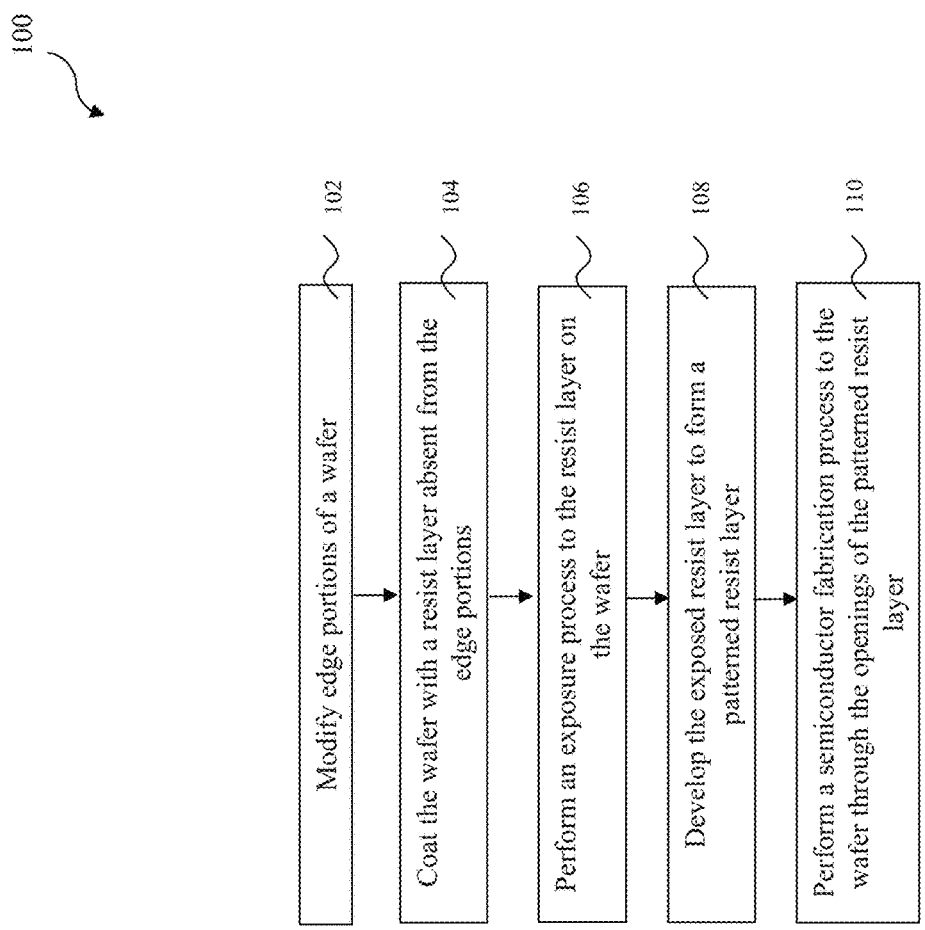
FIG. 1 is a flowchart of a method for integrated circuit fabrication, constructed in accordance with some embodiments.
Figure 2A:
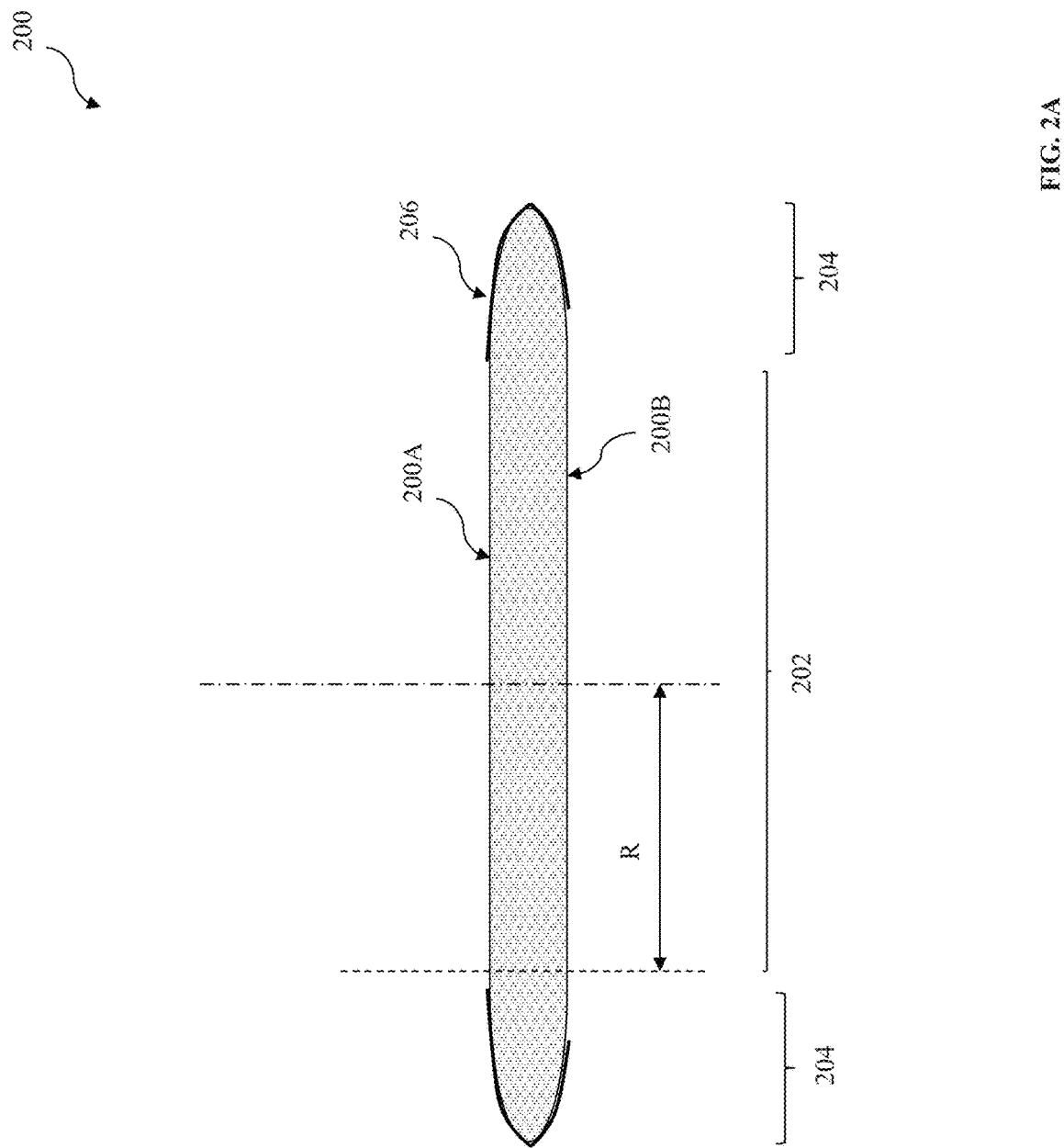
FIG. 2A is a sectional view of a wafer constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 illustrates a flowchart of a method 100 for integrated circuit fabrication in accordance with some embodiments. FIGS. 2-5 illustrate sectional and top views of a wafer 200 at various fabrication stages in accordance with some embodiments. The method 100, the wafer 200 and systems utilized in the method are collectively described with reference to FIGS. 1-5 and other figures.

The method 100 includes an operation 102 to modify edge portion of the wafer 200 such that resist material will not be coated during subsequent operation due to different characteristics of the edge portion. In the present embodiment, the wafer 200 is a semiconductor wafer, such as a silicon wafer. In some embodiments, the wafer 200 may include other elementary semiconductor (such as germanium); a compound semiconductor (such as silicon germanium, silicon carbide, gallium arsenic, gallium phosphide, indium phosphide, indium arsenide, and/or indium antimonide); or combinations thereof. In furtherance of the embodiments, those semiconductor material films may be epitaxially grown on the silicon wafer. In some other embodiments, the wafer 200 may be a substrate of other material.

The wafer 200 has a front surface 200A and a backside surface 200B opposing from each other. One or more integrated circuits are formed, partially formed or to-be formed on the front surface 200A of the wafer 200. Therefore, the front surface 200A of the wafer 200 includes a patterned material layer or a material layer to be patterned. For examples, the front surface 200A may include various isolation features (such as shallow trench isolation features), various doped features (such as doped wells, or doped source and drain features), various devices (such as transistors, diodes, imaging sensors, or resistors), various conductive features (such as contacts, metal lines and/or vias of an interconnection structure), packaging material layers (such as bonding pads and/or a passivation layer), or a combination thereof. On a completely fabricated semiconductor wafer, all above material layers and patterns may present on the front surface 200A of the semiconductor wafer 200. In the present example, the semiconductor wafer 200 is still in the fabrication, a subset of the above material layers may be formed on the front surface 200A.

Figure 3A:
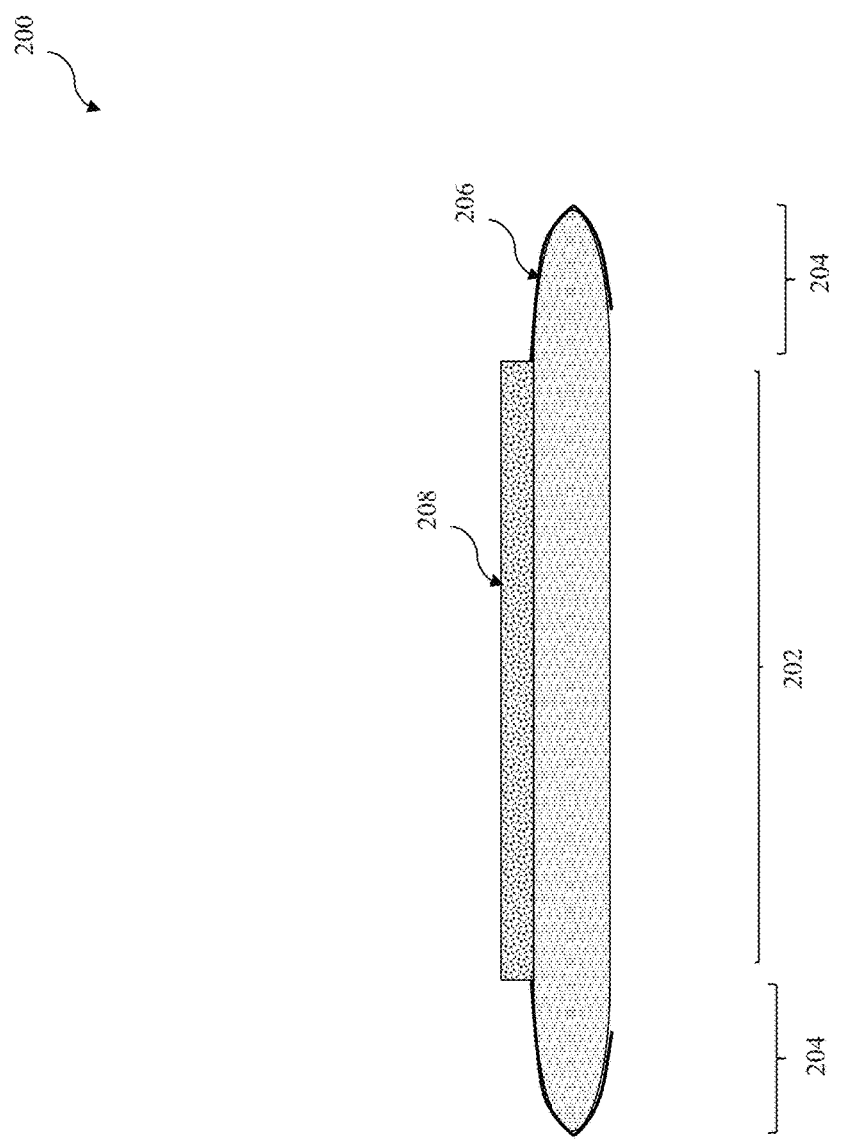
FIGS. 3A and 3B are sectional views of the wafer at a fabrication stage, constructed in accordance with some embodiments.
Figure 3B:
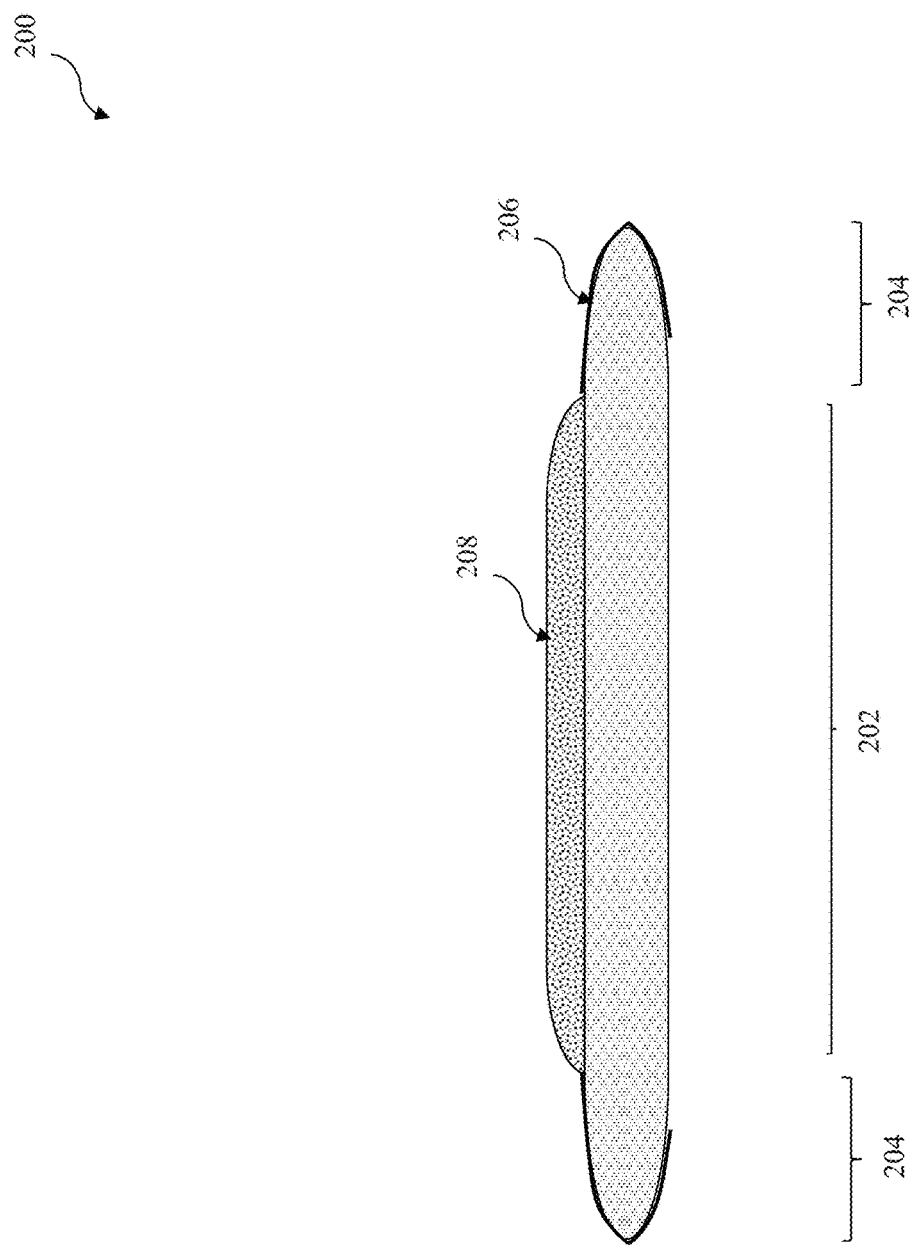

The wafer 200, such as a top material layer on the wafer or a silicon substrate of the wafer, is to be patterned through a lithography process. The wafer 200 includes a circuit region 202 and edge portion 204 surrounding the circuit region 202. The circuit region 202 is a region of the wafer 200 within which the integrated circuits are formed on the top surface 200A of the wafer. The circuit region 202 includes multiple integrated circuits that will be cut to form multiple integrated circuit chips at the backend of the fabrication. The circuit region 202 also includes scribing lines between the integrated circuit chips. Various test patterns may be formed in the scribing lines for various testing, monitoring and fabrication purposes. The edge portion 204 of the wafer 200 is a region without circuit and is not to be patterned during the fabrication. The edge portion 204 includes the portion at the edge of the front surface 200A, and may further include the bezel surface and the edge portion of the backside surface 200B of the wafer. In the operation 102, the edge portion 204 is modified to form a repellant layer 206, as illustrated in FIGS. 3A and 3B, that disfavors and constrains the edge portion 204 from deposition and formation of resist material. The edge portion 204 of the wafer 200 may be modified through a suitable mechanism in accordance to various embodiments.

Figure 6:
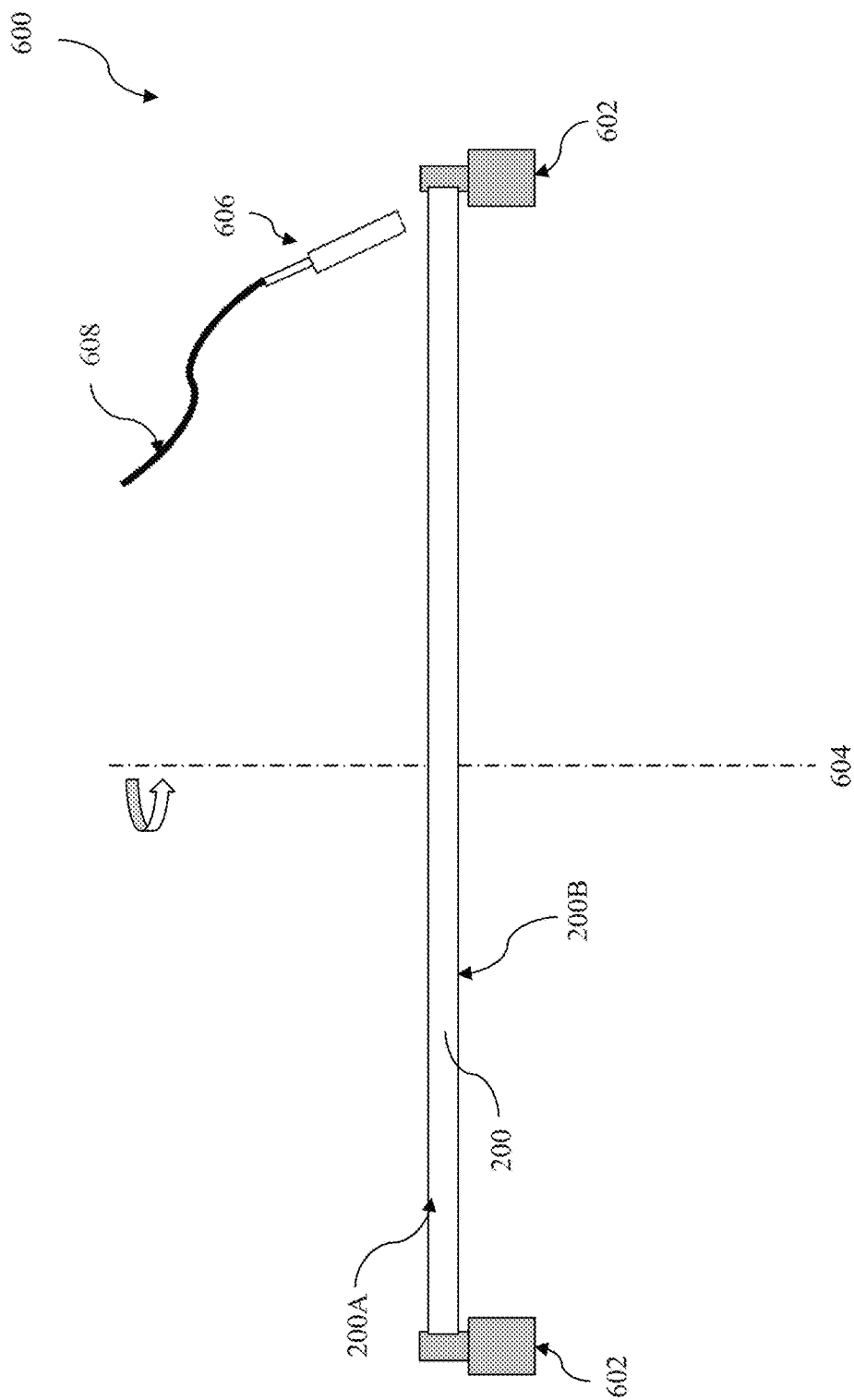
FIG. 6 is a schematic and sectional view of a coating apparatus used by the method in FIG. 1, constructed in accordance with some embodiments.

The edge portion 204 may be modified by a selective coating process to form the repellant layer 206 on the edge portion 204 of the wafer 200. In some embodiments, the selective coating process includes spray coating to form the repellant material layer 206 on the edge portion 204 of the wafer 200. Particularly, the spray coating process may utilize a spray coating apparatus 600 as illustrated in FIG. 6. The spray coating apparatus 600 includes a wafer stage 602 designed to secure the wafer 200 for spray coating. The wafer stage 602 is operable to rotate around the axis 604 such that the wafer 200 secured thereon spins as well. The spray coating apparatus 600 also includes a spray tip 606 designed to spray a chemical solution, such as polymer solution from a chemical supplier 608 connected to the spray tip. The spray tip 606 is configured to aim at the edge portion 206 of the wafer 200 and is able to spray the chemical solution thereto. The operation 102 includes spraying the chemical solution to the edge portion 204 of the wafer 200 and simultaneously spinning the wafer 200 such that the chemical solution is uniformly spun coated on the edge portion 204. The operation 102 may further include curing, such as curing at elevated temperature or by ultraviolet irradiation, the coated chemical solution to form the repellant material layer 206 at the edge portion 204. In some embodiments, thus formed repellant material layer 206 may include a polymer material layer that is repellant to the resist. For examples, when the resist is hydrophobic and the repellant polymer material is hydrophilic. In some other examples, when the resist is hydrophilic and the repellant polymer material is hydrophobic. In various examples, the repellant polymer material includes polyamide, polyimides, polycarbonates, polydiene, polyesters, polyethers, polyfluorocarbons, olefins, polystyrene, poly(vinyl acetals), polyvinylester, poly(vinylpyridine), poly(vinylethers), polyketone, poly(vinylpyrrolidone), or silicone. Particularly, the repellant material layer includes a hydrophobic polymer material, such as amide, imides, carbonates, dienes, esters, ethers, fluorocarbons, olefins, styrene, vinyl acetals, vinyl ester, vinylpyridine, vinyl ethers, ketone, or vinylpyrrolidone, according to some examples. Alternatively, the repellant material layer includes a hydrophilic polymer material, such as acrylamide, acrylic acid, methacrylate, ethylene glycol, or vinyl alcohol, according to some examples.

Figure 7:
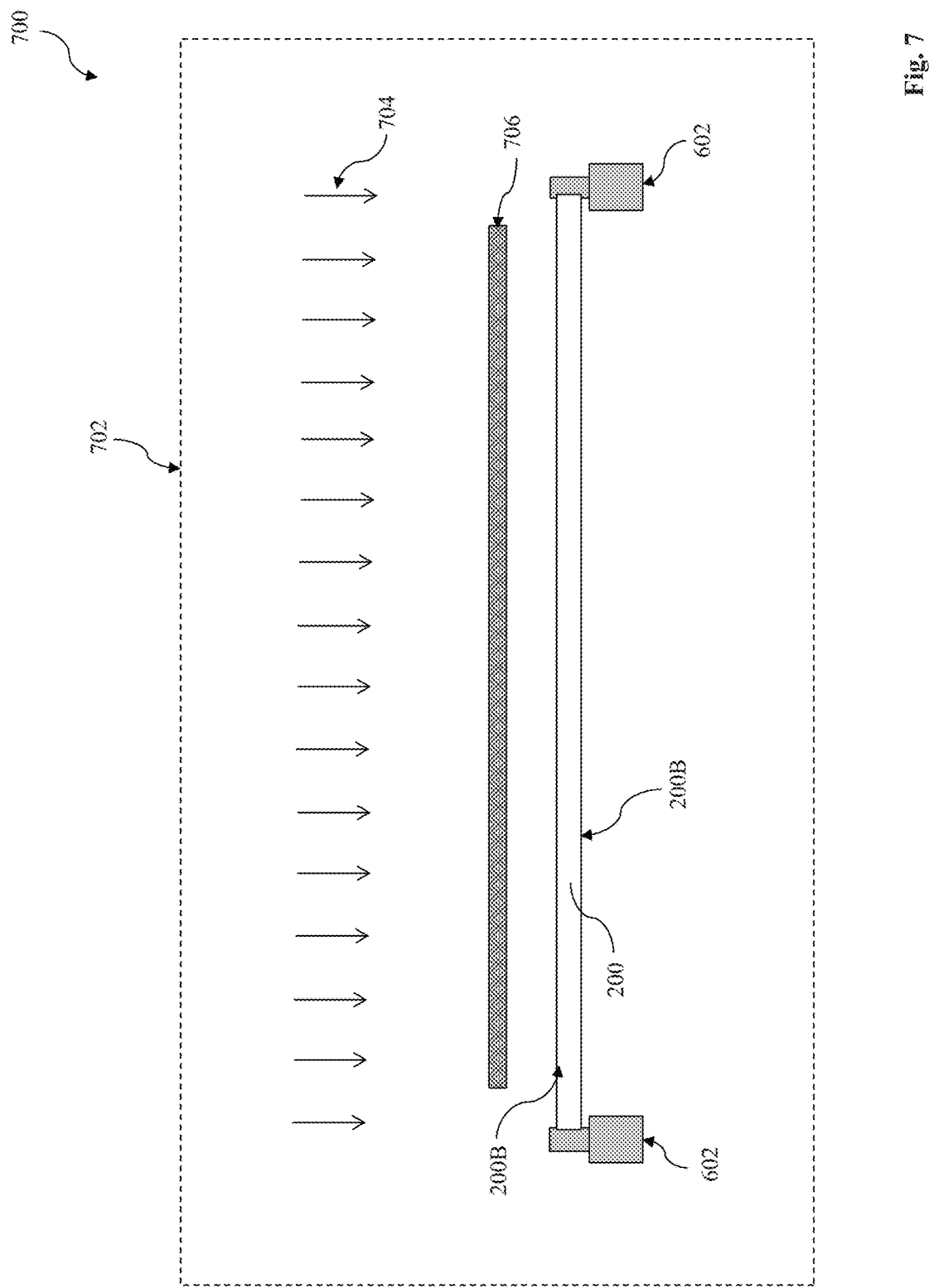
FIG. 7 is a schematic and sectional view of an ion implantation apparatus used by the method in FIG. 1, constructed in accordance with some embodiments.
Figure 8:
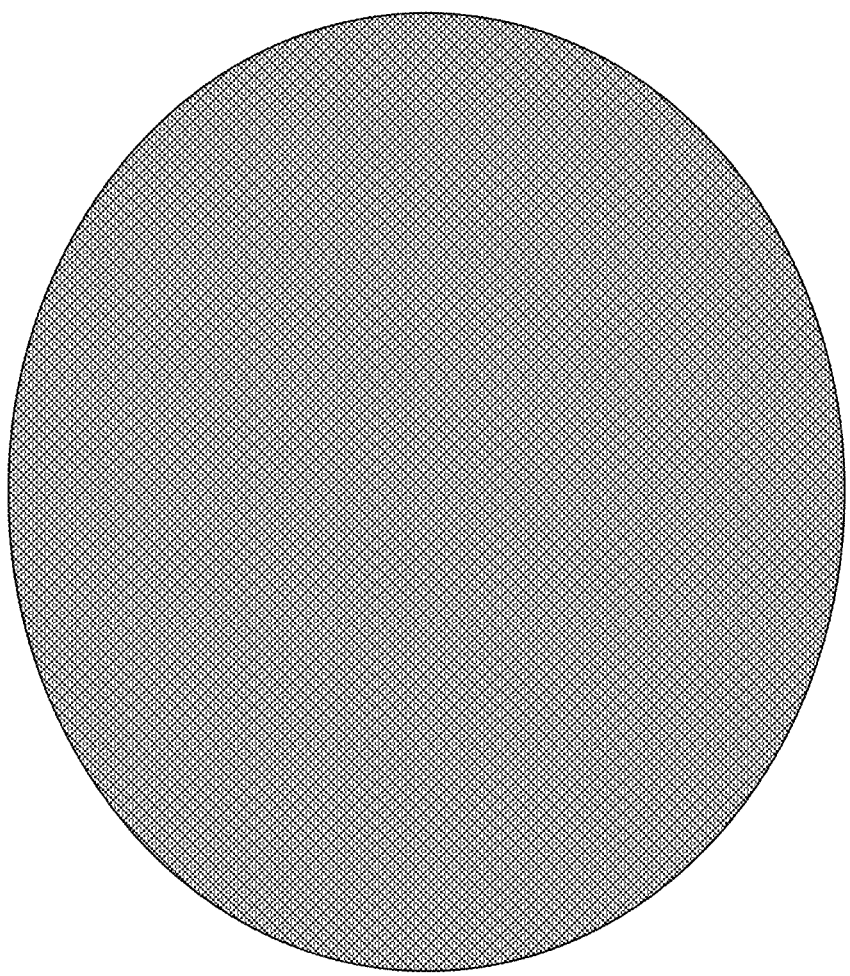
FIG. 8 is a top view of a blocker used in the ion implantation apparatus in FIG. 7, constructed in accordance with some embodiments.

The edge portion 204 may be modified by ion implantation using an implantation species to form the repellant layer 206 on the edge portion 204 of the wafer 200. In some embodiments, the ion implantation process implements an ion implantation apparatus 700 as illustrated in FIG. 7. The ion implantation apparatus 700 includes an ion implantation chamber 702 and a wafer stage 602 configured in the chamber 702. The wafer stage 602 is designed to secure the wafer 200. The ion implantation apparatus 700 is operable to generate ions 704 of a certain species and further includes a mechanism to apply the ion implantation only to the edge portion 204 of the wafer. In some embodiments, a blocker 706 is designed and configured to block the ion implantation from the circuit region 202. The blocker 706, as further illustrated in FIG. 8 in a top view, is a round shaped plate and has a size less than that of the wafer 200. For example, the blocker 706 has a radius equal to or close to the radius R of the circuit region 202 of the wafer 200 (see FIG. 2A). The blocker may be made of a suitable material, such as quartz, to resist ion implantation without introducing any contamination to the wafer 200 and the ion implantation chamber 702. The blocker 706 is configured in the ion implantation chamber 702 to cover the circuit region 202 of the wafer 200 and effectively block it from implantation.

The ion implantation in the operation 102 to the edge portion 204 of the wafer 200 with a certain species, such as metal, metal alloy, fluorine, carbon, titanium nitride. In one example, the metal species include titanium, such as titanium or titanium alloy. In another example, the species used in the ion implantation includes silicon carbide, ceramic, titanium-aluminum-niobium, or titanium nitride. Thus formed modified edge portion 206 may include fluorine, silicon carbide, titanium nitride, titanium, or other suitable metal. The concentration of the implanted species is tuned to be high enough such that the modified edge portion 204 functions effectively as a repellant layer to disfavor the formation of the resist within the edge portion 204.

Figure 9:
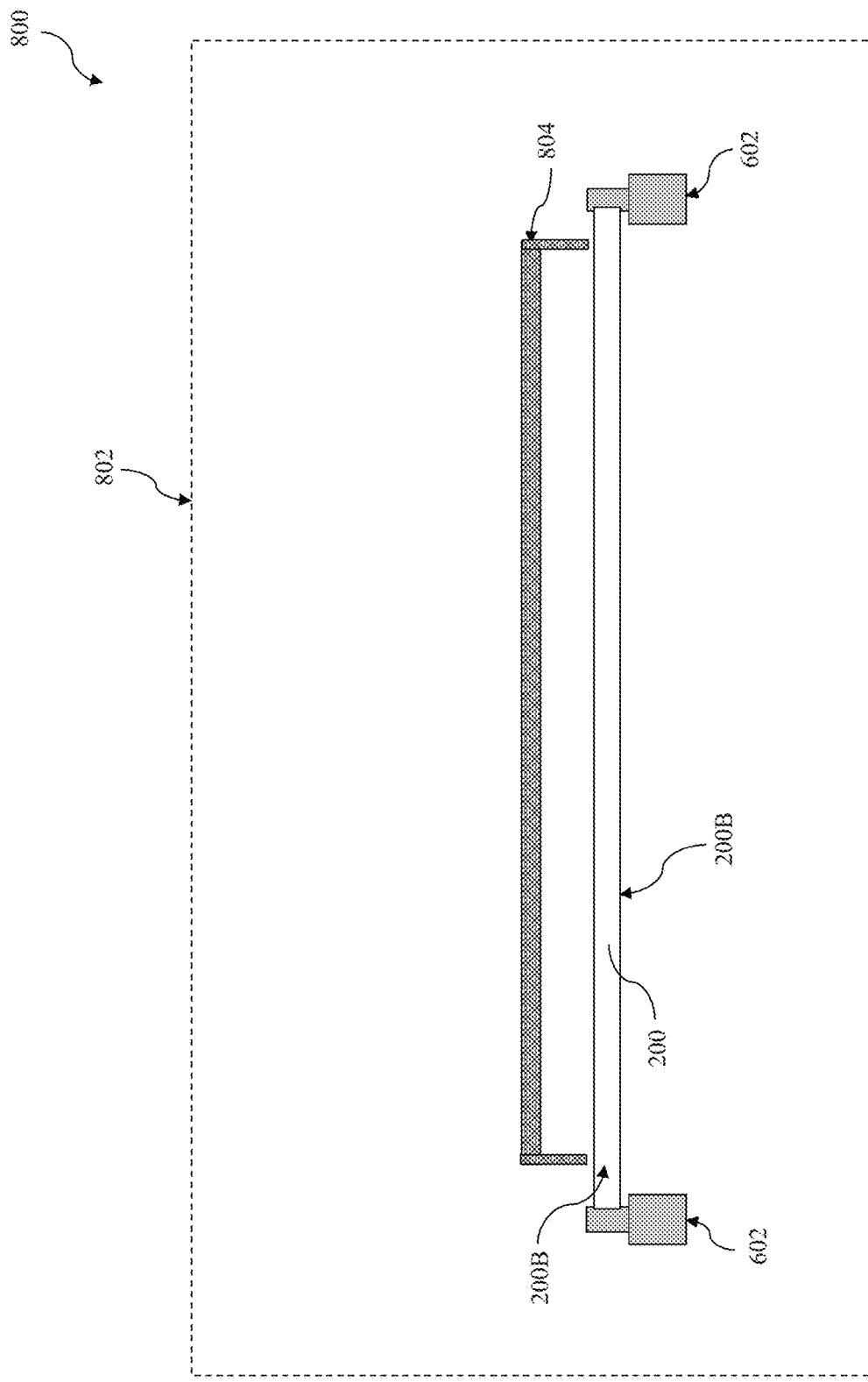
FIG. 9 is a schematic and sectional view of a deposition apparatus used by the method in FIG. 1, constructed in accordance with some embodiments.

The edge portion 204 may be modified other selective deposition method to form the repellant layer 206 on the edge portion 204 of the wafer 200. In some embodiments, the selective deposition method includes a physical vapor deposition (PVD) or a chemical vapor deposition (CVD). In some embodiments, the selective deposition includes a CVD process and uses a precursor that includes silane ($SiH_4$). The precursor may further include other chemical, such as oxygen to form a silicon oxide layer at the edge portion 204 of the wafer 200. The precursor may alternatively include a silicon-containing gas (such as silane) and a carbon-containing gas (such and carbon dioxide) to form a silicon carbide layer at the edge portion 204 of the wafer 200. The selective CVD deposition may be implemented in a CVD apparatus 800 illustrated in FIG. 9. The CVD apparatus 800 includes a CVD processing chamber 802 and a wafer stage 602 to secure the wafer 200. The CVD apparatus 800 further includes a selective deposition mechanism 804 to achieve selective deposition only to the edge portion 204 of the wafer 200. In the present embodiment, the selective deposition mechanism 804 is a blocker designed to effectively prevent the circuit region 202 of the wafer 200 from being deposited. The blocker 804 is further illustrated in FIG. 10 in a perspective view, constructed according to some examples. The blocker 804 is designed and configured to block the deposition from the circuit region 202. The blocker 804 includes a round shaped plate 902 and a side wall 904 extended from the round shaped plate. The round shaped plate 902 has a size less than that of the wafer 200. For example, the round shaped plate 902 has a radius equal to or close to the radius R of the circuit region 202 of the wafer 200 (see FIG. 2A). The blocker may be made of a suitable material, such as quartz, without introducing any contamination to the wafer 200 and the chamber 802. The blocker 804 is configured in the CVD chamber 802 to cover the circuit region 202 of the wafer 200 and effectively prevent it from being deposited.

In some embodiments, the selective deposition includes a PVD process implemented in a PVD apparatus 1000, as illustrated in FIG. 11 in a sectional view. The PVD apparatus includes a PVD processing chamber 1002 and a wafer stage 602 to secure the wafer 200. The PVD apparatus 1000 further includes a selective deposition mechanism to achieve selective deposition only to the edge portion 204 of the wafer 200. The selective deposition mechanism may include a special designed target 1004, a blocker 1006 or a combination thereof. The PVD apparatus 1000 includes the target 1002 of a certain composition, such as titanium. The target 1004 is configured in the chamber 1002 so to be sputtered and then deposited on the wafer 200.

In some embodiment, the selective deposition mechanism includes the target 1002 having a special design, as illustrated in FIG. 12 in a top view. The target 1004 includes a ring portion 1102 matching to the edge portion 204 of the wafer 200 and a central portion 1104 surrounded by the ring portion 1102. In some examples, the ring portion 1102 is made of a suitable target material (such as titanium) to be deposited on the edge portion 204. The central portion 1104 may be made of the same target material but isolated from the ring portion by an isolation feature 1106. Thus, the ring portion 1102 can be independently biased by an electric voltage. In some alternative examples, the central portion is made of an insulating material so that will not be biased. In this case, the ring-shaped isolation feature 1106 is not needed. The target 1004 is configured such that the ring portion 1102 is vertically aligned and matched to the edge portion 204 of the wafer 200. During the operation 102 for selective deposition, the ring portion 1102 of the target 1004 is electrically powered to have sputtering and deposition. Furthermore, the ring portion 1102 of the target 1004 is electrically biased so that the sputtered ions are directed to the edge portion 204 of the wafer 200, thus to achieve the selective deposition.

In some other embodiments, the selective deposition mechanism includes a blocker 1006 designed and configured to effectively prevent the circuit region 202 of the wafer 200 from being deposited. For examples, the blocker 1006 may be designed as same as the blocker 706 in FIG. 8 in terms of shape and size. Specifically, the round shaped blocker 1006 has a radius equal to or close to the radius R of the circuit region 202 of the wafer 200 (see FIG. 2A). Furthermore, the blocker 1006 may be electrically biased (such as positively biased) to expel the sputtered ions from being deposited on the circuit region 202 of the wafer 200. In some other embodiments, the selective deposition is achieved collectively by both the specially designed target 1004 and the blocker 1006.

The selective deposition by PVD may include depositing titanium nitride to the edge portion 204 of the wafer 200 as the repellant material layer 206. In the present example, the target 1004 (or the ring portion 1102) is made of titanium. During the selective deposition, a nitrogen gas is introduced into the PVD chamber 1002. Sputtered titanium and nitrogen will be deposited to form titanium nitride repellant material layer 206. Additionally, a carry gas, such as argon, is further provided to carry nitrogen or nitrogen-containing gas to the PVD chamber 1002. Alternatively, other suitable metal or metal alloy or metal compound may be deposited to form the repellant material layer 206.

As described above, the modification to the edge portion 204 of the wafer 200 includes physical modification (such as ion implantation) or chemical modification (such as selective deposition or coating). The modification may be applied only to the front surface 200A within the edge portion 204, or additionally applied to the backside surface 200B within the edge portion 204.

Referring back to FIG. 1, after the modification of the edge portion 204 of the wafer 200 by the operation 102, the method 100 proceeds to an operation 104 to coat a resist layer 208 on the wafer 200, as illustrated in FIG. 3A. Specifically, the resist layer 208 is coated on the front surface 200A of the wafer 200 in the circuit region 202 while the edge portion 204 is free of the resist layer, due to the characteristics of the repellant material layer 206 formed on the edge portion 204. For example, if the resist material is water based solution, the repellant material layer 206 is hydrophobic. Due to the surface tension, composition differences among the wafer, the repellant material and the resist material, the edge of the resist layer 208 may have a different geometry, such as rounded edge, as illustrated in FIG. 3B.

The resist layer 208 is sensitive to radiation used in a lithography exposure process and has a resistance to etch (or implantation). In an embodiment, the resist layer 208 is formed by spin-on coating process. In some embodiments, the resist layer 208 is further treated with a soft baking process. In some embodiments, the resist layer 208 is sensitive to a radiation, such as I-line light, a deep ultraviolet (DUV) light (e.g., 248 nm radiation by krypton fluoride (KrF) excimer laser or 193 nm radiation by argon fluoride (ArF) excimer laser), an extreme ultraviolet (EUV) light (e.g., 135 nm light), an electron beam (e-beam), and an ion beam. In some examples, the resist layer 208 is soluble in a positive tone developer after being exposed by the radiation.

The resist layer 208 may include a photosensitive chemical, a polymeric material and a solvent. In some embodiments, the resist layer 208 utilizes a chemical amplification (CA) resist material. For example, the CA resist material is positive tone and includes a polymer material that turns soluble to a developer after the polymeric material is reacted with acid. In another example, the CA resist material is negative tone and includes a polymer material that turns insoluble to a developer such as a base solution after the polymer is reacted with acid. In yet another example, the CA resist material includes a polymer material that changes its polarity after the polymer is reacted with acid so that either exposed portions or unexposed portions will be removed during a developing process, depending on the type of developer (organic solvent or aqueous solvent). In one example, the CA resist includes photo-acid generator (PAG) as the photosensitive chemical and may include other sensitive chemical, such as sensitizer as used in EUV CA resist material. The polymer material in a CA resist material may further include an acid-labile group (ALG).

Figure 4:
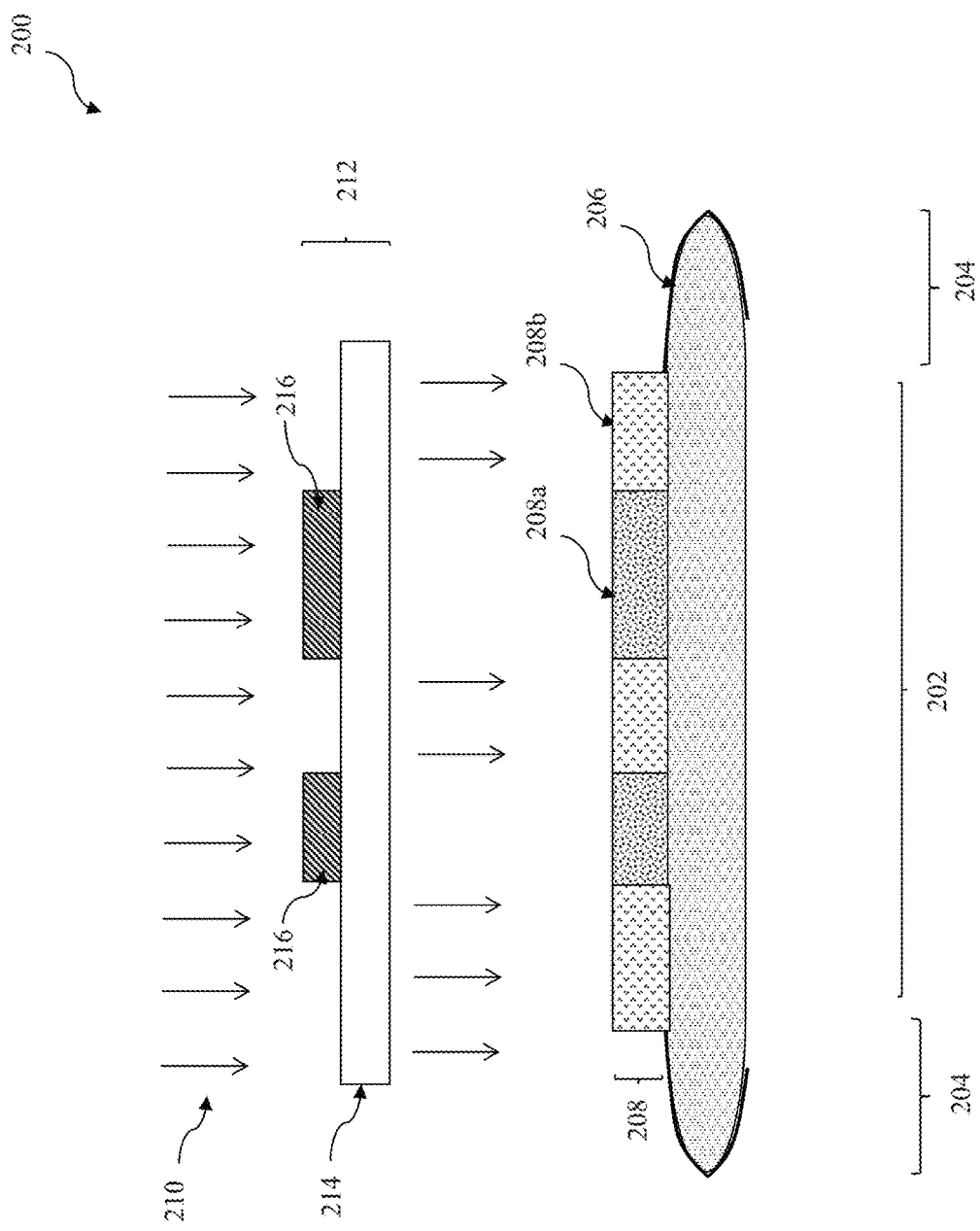
FIGS. 4 and 5 are sectional views of the wafer at various fabrication stages, constructed in accordance with some embodiments.

Referring to FIGS. 1 and 4, the method 100 proceeds to operation 106 by performing an exposing process to the resist layer 208 to a radiation 210 in a lithography system. As noted, the radiation 210 may be an I-line, a DUV radiation, a EUV radiation, or other suitable radiations. The operation 106 may be performed in air, in a liquid (immersion lithography), or in a vacuum (e.g., for EUV lithography and e-beam lithography). In some embodiments, the radiation beam 210 is patterned with a mask 212, such as a transmissive mask or a reflective mask, which may include resolution enhancement techniques such as phase-shifting, off-axis illumination (OAI) and/or optical proximity correction (OPC). In some other embodiments, the radiation beam is directly modulated with a predefined pattern, such as an IC layout, without using a mask (such as using a digital pattern generator or direct-write mode). In the illustrative embodiment, the radiation beam is directed to a transmissive mask 212 that includes a transparent substrate (such as fused quartz) 214, a patterned opaque layer (such as chromium) 216. In furtherance of the example using a CA resist material with PAG, acids are generated in the exposed region during the exposing process.

The operation 106 may additionally include other steps, such as thermal treatment. In the present embodiment, the operation 106 includes a post-exposure baking (PEB) process to the wafer 200, especially to the resist layer 208 coated on the wafer 200. During the PEB process, more acids are generated and the exposed portions of the resist material 208 are changed chemically (such as more hydrophilic or more hydrophobic). In a specific embodiment, the PEB process may be performed in a thermal chamber at temperature ranging between 60° C. and 160° C.

After the operation 106, a latent pattern is formed on the resist layer 208. The latent pattern of a resist layer refers to the exposed pattern on the resist layer, which eventually becomes a physical resist pattern, such as by a developing process. The latent pattern of the resist layer 208 includes unexposed portions 208a and exposed portions 208b. In the present case, of the latent pattern, the exposed portions 208b of the resist layer 208 are physically or chemically changed. In some examples, the exposed portions 208b are de-protected, inducing polarity change for dual-tone imaging (developing). In other examples, the exposed portions 208b are changed in polymerization, such as depolymerized as in positive resist or cross-linked as in negative resist.

Figure 5:
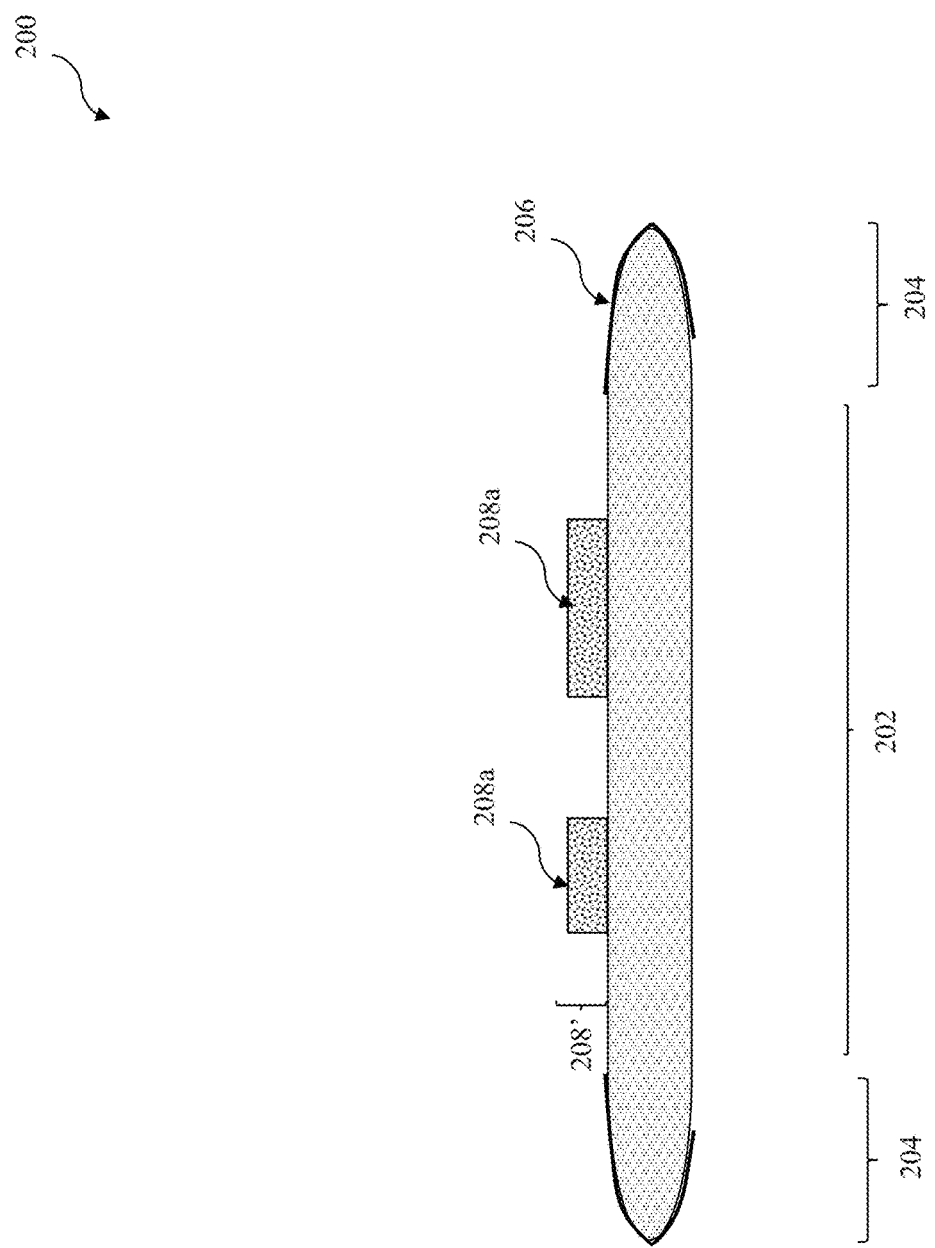

Referring to FIGS. 1 and 5, the method 100 then proceeds to operation 108 by developing the exposed resist layer 208 in a developer, constructed in accordance with some embodiments. By the developing process, a patterned resist layer 208' is formed. In some embodiments, the resist layer 208 experiences a polarity change after the operation 106, and a dual-tone developing process may be implemented. In some examples, the resist layer 208 is changed from a nonpolar state (hydrophobic state) to a polar state (hydrophilic state), then the exposed portions 208b will be removed by an aqueous solvent (positive tone imaging), such as tetramethyl ammonium hydroxide (TMAH), or alternatively the unexposed portions 208a will be removed by an organic solvent (negative tone imaging), such as butyl acetate. In some other examples, the resist layer 208 is changed from a polar state to a nonpolar state, then the exposed portions 208b will be removed by an organic solvent (positive tone imaging) or the unexposed portions 208a will be removed by an aqueous solvent (negative tone imaging).

In the present example illustrated in FIG. 5, the exposed portions 208b are removed in the developing process. In this example shown in FIG. 5, the patterned resist layer 208' is represented by two line patterns. However, the following discussion is equally applicable to resist patterns represented by trenches.

Still referring to FIGS. 1 and 5, the method 100 includes an operation 110 by performing a fabrication process to the wafer 200 using the patterned resist layer 208' as a mask such that the fabrication process is only applied to the portions of the wafer 200 within the openings of the patterned resist layer 208' while other portions covered by the patterned resist layer 208' are protected from being impacted by the fabrication process. In some embodiments, the fabrication process includes an etching process applied to wafer 200 (a top material layer on the wafer) using the patterned resist layer 208' as an etch mask, thereby transferring the pattern from the patterned resist layer 208' to the wafer (or the top material layer on the wafer). In alternative embodiments, the fabrication process includes an ion implantation process applied to the wafer 200 using the patterned resist layer 208' as an implantation mask, thereby forming various doped features in the wafer 200.

In some example, the top material layer is a hard mask layer. To further this embodiment, the pattern is first transferred from the patterned resist layer 208' to the hard mask layer, then to other layers of the wafer 200. For example, the hard mask layer may be etched through openings of the patterned resist layer 208' using a dry (plasma) etching, a wet etching, and/or other etching methods. For example, a dry etching process may implement an oxygen-containing gas, a fluorine-containing gas, a chlorine-containing gas, a bromine-containing gas, an iodine-containing gas, other suitable gases and/or plasmas, and/or combinations thereof. The patterned resist layer 208' may be partially or completely consumed during the etching of the hard mask layer. In an embodiment, any remaining portion of the patterned resist layer 208' may be stripped off, leaving a patterned hard mask layer over the wafer.

Although not shown in FIG. 1, the method 100 may include other operations before, during or after the operations described above. In an embodiment, the wafer 200 is a semiconductor substrate and the method 100 proceeds to forming fin field effect transistor (FinFET) structures. In this embodiment, the method 100 includes forming a plurality of active fins in the semiconductor substrate of the wafer. In furtherance of the embodiment, the operation 110 further includes etching the substrate through the openings of the patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In another embodiment, the method 100 includes other operations to form a plurality of gate electrodes on the semiconductor substrate of the wafer 200. The method 100 may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate, which has been etched by operation 110 to form a plurality of trenches. The method 100 proceeds to filling the trenches with a conductive material, such as a metal; and polishing the conductive material using a process such as chemical mechanical planarization (CMP) to expose the patterned ILD layer, thereby forming the metal lines in the ILD layer. The above are non-limiting examples of devices/structures that can be made and/or improved using the method 200 according to various aspects of the present disclosure.

As described above, the semiconductor wafer 200 may be an intermediate structure fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The present disclosure provides a polish system and a method utilizing the same. The disclosed method includes modifying the wafer edge physically or chemically such that the resist material is coated on the front surface of the wafer within the circuit region so that the wafer edge is free of resist material during a lithography patterning method including resist coating.

The embodiments of the present disclosure offer advantages over existing art, though it is understood that other embodiments may offer different advantages, not all advantages are necessarily discussed herein, and that no particular advantage is required for all embodiments. By utilizing the disclosed method, the accumulation of the resist material on wafer edge and associated issues (such as contamination and resist peeling) are eliminated. In other examples, the disclosed method to form a modified wafer edge is easy to implement, therefore the manufacturing cost is reduced and the manufacturing throughput is increased. Furthermore, there is no additional contamination introduced by the wafer edge modification.

Thus, the present disclosure provides a semiconductor fabrication method. The method includes modifying an edge portion of a wafer such that the edge portion are prevented from resist coating; coating a resist layer on the front surface of the wafer, wherein the resist layer is free from the edge portion of the wafer; and performing an exposing process to the resist layer.

The present disclosure provides another embodiment of a method for lithography patterning. The method includes modifying an edge portion of a wafer in a processing apparatus using a blocker designed and configured to block a circuit region on the front surface of the wafer from being modified; coating a resist layer on the front surface of the wafer, wherein the resist layer is coated in the circuit region and is free from the edge portion of the wafer; and performing an exposing process to the resist layer.

The present disclosure provides an embodiment of a method for lithography patterning. The method includes spray coating a polymer solution on an edge portion of a wafer; curing the polymer solution to form a polymer material layer that prevents from resist coating; coating a resist layer on the front surface of the wafer, wherein the resist layer is coated in a circuit region and is free from the edge portion of the wafer; and performing an exposing process to the resist layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   modifying an edge portion of a front surface of a wafer such that the edge portion is prevented from resist coating;
   coating a resist layer on the front surface of the wafer, wherein the resist layer is free from the edge portion of the wafer; and
   performing an exposing process to the resist layer.

2. The method of claim 1, wherein the modifying of the edge portion of the wafer includes performing an ion implantation process to the wafer to introduce a species to the edge portion of the wafer while a circuit region on the front surface of the wafer is free from the species.

3. The method of claim 2, wherein the performing of the ion implantation process includes using a blocker designed and configured to block the circuit region on the front surface of the wafer from being ion implanted during the ion implantation process.

4. The method of claim 2, wherein the species used in the ion implantation process includes one of a metal and a metal alloy.

5. The method of claim 4, wherein the metal used in the ion implantation process includes one of titanium and titanium alloy.

6. The method of claim 2, wherein the species used in the ion implantation process includes fluorine.

7. The method of claim 2, wherein the species used in the ion implantation process includes one of silicon carbide, titanium-aluminum-niobium and titanium nitride.

8. The method of claim 1, wherein the modifying of the edge portion of the wafer includes forming a repellant material layer on the edge portion of the wafer, wherein the repellant material layer is free from a circuit region on the front surface of the wafer.

9. The method of claim 8, wherein the forming of the repellant material layer includes
   spray coating a polymer solution on the edge portion of the wafer; and curing the polymer solution to form a polymer material layer on the edge portion of the wafer.

10. The method of claim 9, wherein the spray coating of the polymer solution includes
   delivering the polymer solution to the edges of the wafer using a spray head configured to aim at the edge portion of the wafer; and
   simultaneously spinning the wafer during the delivering of the polymer solution.

11. The method of claim 9, wherein the forming of the repellant material layer includes forming a hydrophobic polymer material selected from the group consisting of amide, imides, carbonates, dienes, esters, ethers, fluorocarbons, olefins, styrene, vinyl acetals, vinyl ester, vinylpyridine, vinyl ethers, ketone, and vinylpyrrolidone.

12. The method of claim 9, wherein the forming of the repellant material layer includes forming a hydrophilic polymer material selected from the group consisting of acrylamide, acrylic acid, methacrylate, ethylene glycol, and vinyl alcohol.

13. The method of claim 8, wherein the forming of the repellant material layer includes performing a deposition process in a deposition apparatus designed and configured to constrain the repellant material layer to be deposited on the edge portion of the wafer.

14. The method of claim 13, wherein the forming of the repellant material layer includes performing a physical vapor deposition (PVD) process in a PVD apparatus using a ring-shaped target that substantially matches the edge portion of the wafer.

15. The method of claim 14, wherein the forming of the repellant material layer includes configuring a blocker and applying a bias voltage to the blocker such that the repellant material layer is not deposited in the circuit region of the wafer.

16. The method of claim 14, wherein the forming of the repellant material layer includes forming a titanium nitride layer.

17. The method of claim 1, wherein modifying the edge portion of the front surface of the wafer includes at least one of ion implantation and forming a repellant material.

18. A method, comprising:
   modifying an edge portion of a front surface of a wafer in a processing apparatus using a blocker designed and configured to block a circuit region on the front surface of the wafer from being modified;
   coating a resist layer on the front surface of the wafer, wherein the resist layer is coated in the circuit region and is free from the edge portion of the wafer; and
   performing an exposing process to the resist layer.

19. The method of claim 18, wherein modifying the edge portion of the wafer includes one of ion implanting with a species to the edge portion and depositing a repellant material layer on the edge portion.

20. A method, comprising:
   spray coating a polymer solution on an edge portion of a front surface of a wafer;
   curing the polymer solution to form a polymer material layer that prevents resist from coating on the edge portion of the wafer;
   coating a resist layer on the front surface of the wafer, wherein the resist layer is coated in a circuit region and is free from the edge portion of the wafer; and
   performing an exposing process to the resist layer.

* * * * *